(12) United States Patent
Tseng et al.

(10) Patent No.: US 11,217,499 B2
(45) Date of Patent: Jan. 4, 2022

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventors: Chi Sheng Tseng, Kaohsiung (TW); Lu-Ming Lai, Kaohsiung (TW); Hui-Chung Liu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/448,970

(22) Filed: Jun. 21, 2019

(65) Prior Publication Data

US 2020/0402879 A1    Dec. 24, 2020

(51) Int. Cl.
| | |
|---|---|
| *H01L 23/31* | (2006.01) |
| *B81B 7/00* | (2006.01) |
| *H01L 23/10* | (2006.01) |
| *B06B 1/06* | (2006.01) |
| *H01L 21/56* | (2006.01) |
| *B81C 1/00* | (2006.01) |

(52) U.S. Cl.
CPC ........ *H01L 23/3142* (2013.01); *B06B 1/0629* (2013.01); *B81B 7/0077* (2013.01); *B81C 1/00158* (2013.01); *H01L 21/565* (2013.01); *H01L 23/10* (2013.01); *B81B 7/0032* (2013.01); *H01L 2924/1461* (2013.01)

(58) Field of Classification Search
CPC combination set(s) only.
See application file for complete search history.

(56) References Cited

U.S. PATENT DOCUMENTS

| | | | | |
|---|---|---|---|---|
| 2003/0134450 | A1* | 7/2003 | Lee | H01L 23/13 438/106 |
| 2007/0290364 | A1* | 12/2007 | Gupta | B81C 1/00341 257/777 |
| 2008/0217708 | A1* | 9/2008 | Reisner | H01L 23/645 257/416 |
| 2009/0102060 | A1* | 4/2009 | Goida | H01L 24/27 257/777 |
| 2012/0306074 | A1* | 12/2012 | Kobayashi | H01L 23/3128 257/737 |
| 2013/0075926 | A1* | 3/2013 | Bae | H01L 25/105 257/774 |
| 2015/0037914 | A1* | 2/2015 | Takahashi | H01L 25/0652 438/15 |
| 2019/0259932 | A1* | 8/2019 | Procopio | B06B 1/0622 |
| 2019/0393193 | A1* | 12/2019 | Eid | H01L 24/73 |
| 2020/0287126 | A1* | 9/2020 | Chang | H01L 41/042 |

* cited by examiner

*Primary Examiner* — Moin M Rahman
(74) *Attorney, Agent, or Firm* — Foley & Lardner LLP

(57) ABSTRACT

A semiconductor package structure includes a substrate; a first die on the substrate, wherein an active surface of the first die is facing away from the substrate; a second die on the active surface of the first die, electrically connected to the first die through a plurality of conductive terminals; and a sealing structure on the active surface of the first die, surrounding the plurality of conductive terminals and abutting the second die thereby forming a cavity between the first die and the second die. A method for manufacturing the semiconductor package structure is also provided.

4 Claims, 11 Drawing Sheets

SEMICONDUCTOR PACKAGE STRUCTURE AND METHOD FOR MANUFACTURING THE SAME

BACKGROUND

1. Technical Field

The present disclosure relates to a package of a micro-electro-mechanical system (MEMS) device, and more particularly to a package of a large die size MEMS device which provides better product yield.

2. Description of the Related Art

Piezoelectric micromachined ultrasonic transducers (PMUTs) are MEMS devices which operate in response to flexural motion of a thin membrane coupled with a thin piezoelectric film, instead of thickness-mode motion of a plate of piezoelectric ceramic as within bulk piezoelectric ultrasound transducers. It will be noted that PMUTs are a class of micromachined ultrasonic transducers (MUTs). In comparison with bulk piezoelectric ultrasound transducers, PMUTs can offer advantages such as increased bandwidth, flexible geometries, natural acoustic impedance match with water or air, reduced voltage demands, mixing of different resonant frequencies and potential for integration with supporting electronic circuits especially for miniaturized high frequency applications.

SUMMARY

In some embodiments, the present disclosure provides a semiconductor package structure including a substrate; a first die on the substrate, wherein an active surface of the first die is facing away from the substrate; a second die on the active surface of the first die, electrically connected to the first die through a plurality of conductive terminals; and a sealing structure on the active surface of the first die, surrounding the plurality of conductive terminals and abutting the second die thereby forming a cavity between the first die and the second die.

In some embodiments, the present disclosure provides a semiconductor package structure including a substrate; a first die on the substrate; a second die on the first die, the second die having a plurality of cell regions, each of the cell regions having a membrane portion, a transmission portion connected to the membrane portion, and a receiving portion connected to the membrane portion; and a sealing structure surrounding the plurality of cell regions.

In some embodiments, the present disclosure provides a method for manufacturing a semiconductor package structure, the method including: (1) providing a first die and a second die; (2) bonding the second die to the first die through a plurality of conductive terminals; and (3) forming a sealing structure on the first die surrounding the plurality of conductive terminals and abutting the second die thereby forming a cavity between the first die and the second die.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

DETAILED DESCRIPTION

Figure 1:
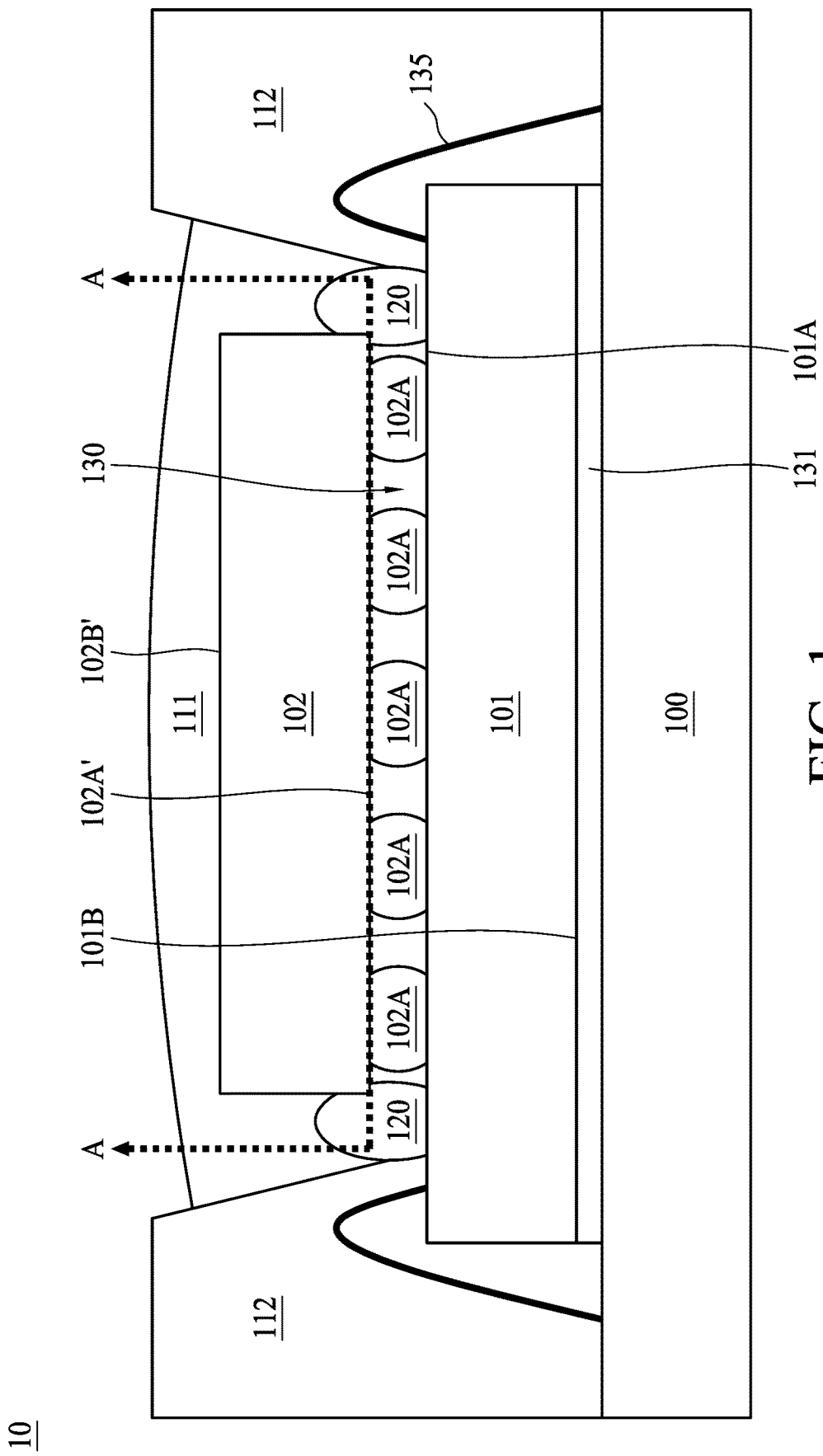
FIG. 1 illustrates a cross sectional view of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Comparative PMUT packaging operation utilizes eutectic wafer bonding, for example, AlGe, as signal connection between the PMUT die and CMOS die. Eutectic wafer bonding also provides vacuum cavity to individual PMUT cell including at least a membrane, a transducer surface including a transmission portion and a receiving portion.

In some applications where the size of the PMUT die increases, number of PMUT cell per PMUT die and thus eutectic bonding sites per PMUT die inevitably increase. Eutectic bonding technique strongly affects PMUT package yield under the scenario of high eutectic bonding sites per PMUT die. Such application includes ultrasonic devices used in medical sensing, where the sensing resolution is positively correlated to the size of the PMUT die.

Present disclosure provides a eutectic bonding-free PMUT package structure. The eutectic bonding is replaced by bumping structure, for example, solder bumping and/or copper pillar. The layout of the PMUT package is also changed. In the present disclosure, air cavity is formed to cover a plurality of PMUT cells, whereas comparatively vacuum cavity is formed by eutectic bonding to cover a single PMUT cell.

Referring to FIG. 1, FIG. 1 illustrates a cross sectional view of a semiconductor package structure 10 according to some embodiments of the present disclosure. Semiconductor package structure 10 includes a substrate 100, a die 101 disposed on the substrate 100 with a back surface 101B in connection with the substrate 100, for example. An active surface 101A of the die 101 is opposite to the back surface 101B and is facing away from the substrate 100. In some embodiments, as illustrated in FIG. 1, an electrical connection such as a bonding wire 135 connects the active surface 101A of the die 101 and a top surface of the underlying substrate 100.

The substrate 100 may include a circuitry and/or a redistribution layer (RDL) structure (not illustrated in FIG. 1). The substrate 100 may include a solder mask (SM) structure, conductive pad(s), patterned conductive trace(s), and interconnection(s) (e.g. via(s)). The substrate 100 may include ceramic, semiconductor material (e.g. silicon, high-resistance silicon, high-resistivity silicon, or other suitable semiconductor material), dielectric material, glass or other suitable materials.

In some embodiments, the die 101 in connection with the substrate 100 may include an application specific integrated circuit (ASIC) die. The semiconductor package structure 10 further includes a die 102 stacked over an active surface 101A of the die 101. Die 102 and die 101 are electrically connected through several conductive terminals 102A disposed on a surface 102A' of the die 102. Electrical signal generated from the die 102 can be transmitted to the die 101 through the conductive terminals 102A. In addition, the die 102 is bonded to the die 101 through the conductive terminals 102A.

In some embodiments, the die 102 may include piezoelectric material, which can be exemplified as Aluminum Nitride (AlN), however, it will be appreciated that numerous materials exhibiting piezoelectric behavior may be alternatively utilized without departing from the present teachings. By way of example and not limitation, material may be selected for use from the group of materials exhibiting piezoelectric behavior comprising Apatite, Barium Titanate ($BaTiO_3$), Berlinite ($AlPO_4$), various Ceramic materials, Allium Phosphate, Gallium Nitride (GaN), Gallium Orthophosphate, Lanthanum Gallium Silicate, Lead Scandium Tantalate, Lead Magnesium Niobate (PMN), Lead Zirconate Titanate (PZT), Lithium Tantalate, Polyvinylidene Fluoride (PVDF), Potassium Sodium Tartrate, Quartz ($SiO_2$), Zinc Oxide (ZnO), and other materials and combinations as will be known to one of ordinary skill in the art. By way of example and not limitation, one class of ceramics materials exhibiting piezo electric properties are ceramic structures exhibiting perovskite tungsten-bronze structures, including $BaTiO_3$, $KNbO_3$, $Ba_2NaNb_5O_5$, $LiNbO_3$, $SrTiO_3$, $Pb(ZrTi)O_3$, $Pb_2KNb_5O_{15}$, $LiTaO_3$, $BiFeO_3$, $Na_xWO_3$. In some embodiments, a vertical projection area of the die 102 is smaller than a vertical projection area of the die 101, for example, a vertical projection area of a PMUT die is smaller than a vertical projection of an ASIC die.

The semiconductor package structure 10 further includes a sealing structure 120 disposed on the active surface 101A of the die 101 and abutting an edge of the die 102 at the surface 102A'. From a cross sectional view as shown in FIG. 1, the sealing structure 120 sandwiches or laterally surrounds the conductive terminals 102A at the surface 102A' of the die 102. Whereas from a top view perspective, as will be shown in FIG. 1A and FIG. 1B of the present disclosure, the sealing structure 120 may fully surround the conductive terminals 102A from all sides of the die 102. In some embodiments, a height of the sealing structure 120 is greater than a separation between the die 101 and the die 102, therefore, the sealing structure 120 may effectively seal the space between the die 101 and the die 102 from all sides of the die 102. A cavity 130 can be defined by the surface 102A' of the die 102, the active surface 101A of the die 101, and a sidewall of the sealing structure 120. The plurality of the conductive terminals 102A connecting the die 101 and the die 102 is accommodated in the cavity 130, or sealed within the cavity 130. In some embodiments, the sealing structure 120 may be composed of high-viscosity dielectric materials, for example, high-viscosity polymers, which prevents contamination of the surface 102A' of the die 102 during application.

In some embodiments, the cavity 130 is air-filled, or an air cavity. Different from comparative PMUT package, the cavity 130 of present disclosure is an air cavity with pressure substantially higher than vacuum level. Comparatively, vacuum cavity is widely adopted in PMUT package in order to direct ultrasound propagating away from the vacuum cavity due to the fact that ultrasound can primarily or solely propagate through medium. Air cavity adopted in the present disclosure may proportionally propagate more ultrasound in the direction toward the cavity 130 compared to the vacuum cavity counterpart, thereby rendering reflection at material interfaces and in heterogeneous material. In order not to generate excessive noise caused by the reflection, present disclosure further provides an absorption layer 131 between the back surface 101B and the substrate 100, configured to absorb ultrasound propagating toward the substrate 100. In some embodiments, a die attach layer (not shown in FIG. 1) may be used to connect the die 101 and the substrate 100, In some embodiments, a plurality of die attach layers (not shown in FIG. 1) are stacked with the absorption layer 131, for example, one die attach layer may be disposed between the substrate 100 and the absorption layer 131, and another die attach layer may be disposed between the absorption layer 131 and the die 101. In some embodiments, the sealing structure 120 can be a dam structure.

In some embodiments, as shown in FIG. 1, conductive terminals 102A can be composed of solder materials, for example, solder joints may be used to electrically and mechanically connect die 102 and die 101. Semiconductor package structure 10 further includes an encapsulant 111 covering a back surface 102B' of the die 102. The encapsulant 111 may further cover the sidewall of the die 102 and the sealing structure 120. As shown in FIG. 1, semiconductor package structure 10 may further include another encapsulant 112 on the substrate 100, encapsulating the die 101 from its sidewall and a portion of the active surface 101A. In addition to surrounding the plurality of conductive terminals 102A between the die 102 and the die 101, the encapsulant 112 may further in contact and surround the encapsulant 111. In some embodiments, the encapsulant 111 and the encapsulant 112 are both in contact with the sealing structure 120. In some embodiments, material of the encapsulant 111 may be different from the material of the encapsulant 112, for example, encapsulant 112 may be composed of epoxy, resin, or molding compound with various fillers, whereas encapsulant 111 may be composed of silicone, or epoxy without any fillers In some embodiments, materials of encapsulant 111 may be selected to have an impedance substantially close to human body impedance with respect to ultrasound.

Figure 1A:
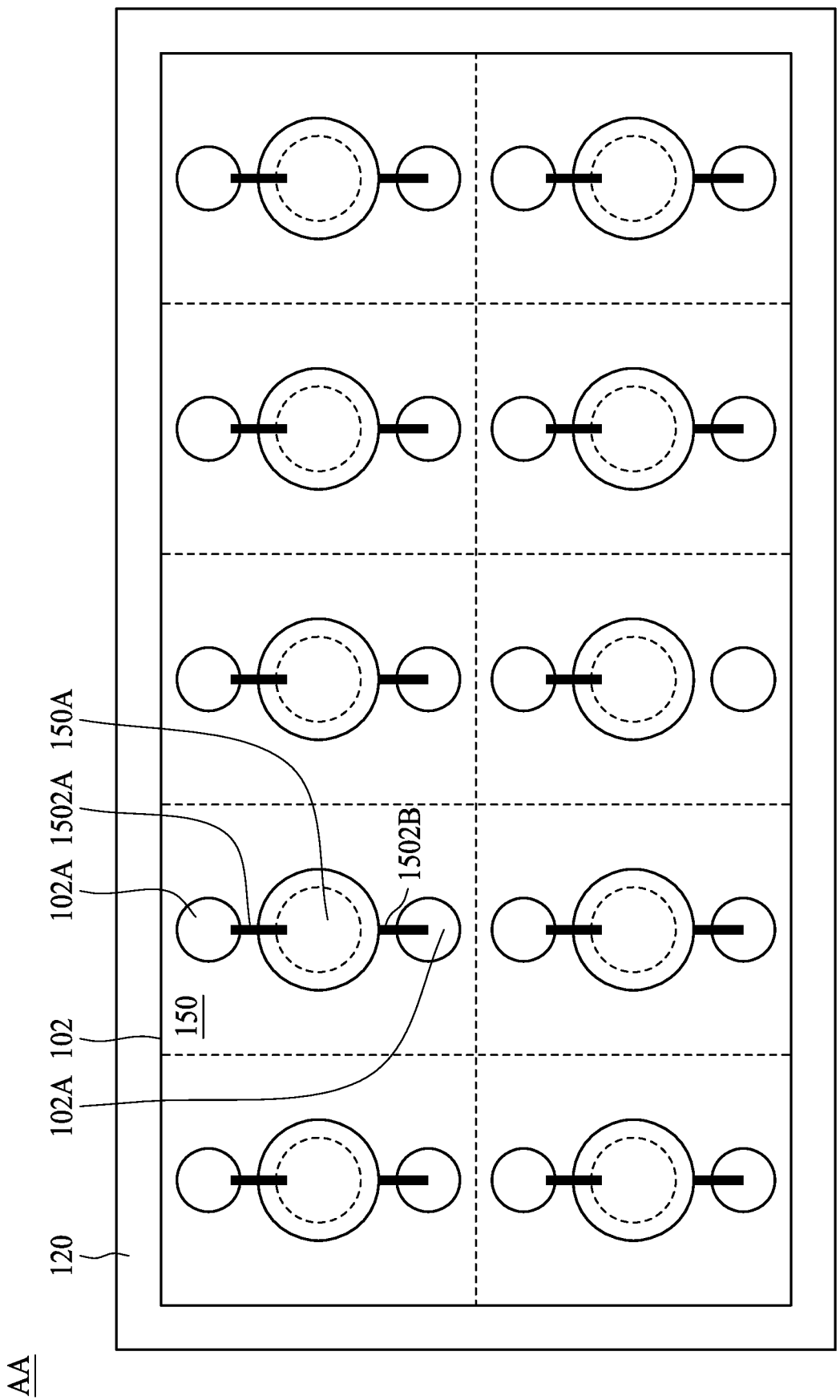
FIG. 1A illustrates a top view of a semiconductor package structure viewing from interface AA of FIG. 1 according to some embodiments of the present disclosure.

Referring to FIG. 1A, FIG. 1A illustrates a top view of a semiconductor package structure viewing from interface AA of FIG. 1 according to some embodiments of the present disclosure. The die 102 includes a plurality of cell regions 150, each of the cell regions 150 includes a membrane portion 150A, and a transducer interface having at least a receiving portion 1502A/102A and a transmission portion 1502B/102A. The receiving portion 1502A/102A may include a conductive wire 1502A electrically coupling one layer of the membrane portion 150A and a conductive terminal 102A, and the transmission portion 1502B/102A may include a conductive wire 1502B electrically coupling another layer of the membrane portion 150A and a conductive terminal 102A. For example, referring to FIG. 1 and FIG. 1A, the receiving portion 1502A/102A and the transmission portion 1502B/102A electrically connect the membrane portion 150A to the active surface 101A of the die 101, so that the each of the PMUT cell may communicate with the die 101 independently. As previously discussed, the conductive terminal 102A can be composed of solder material.

Figure 1B:
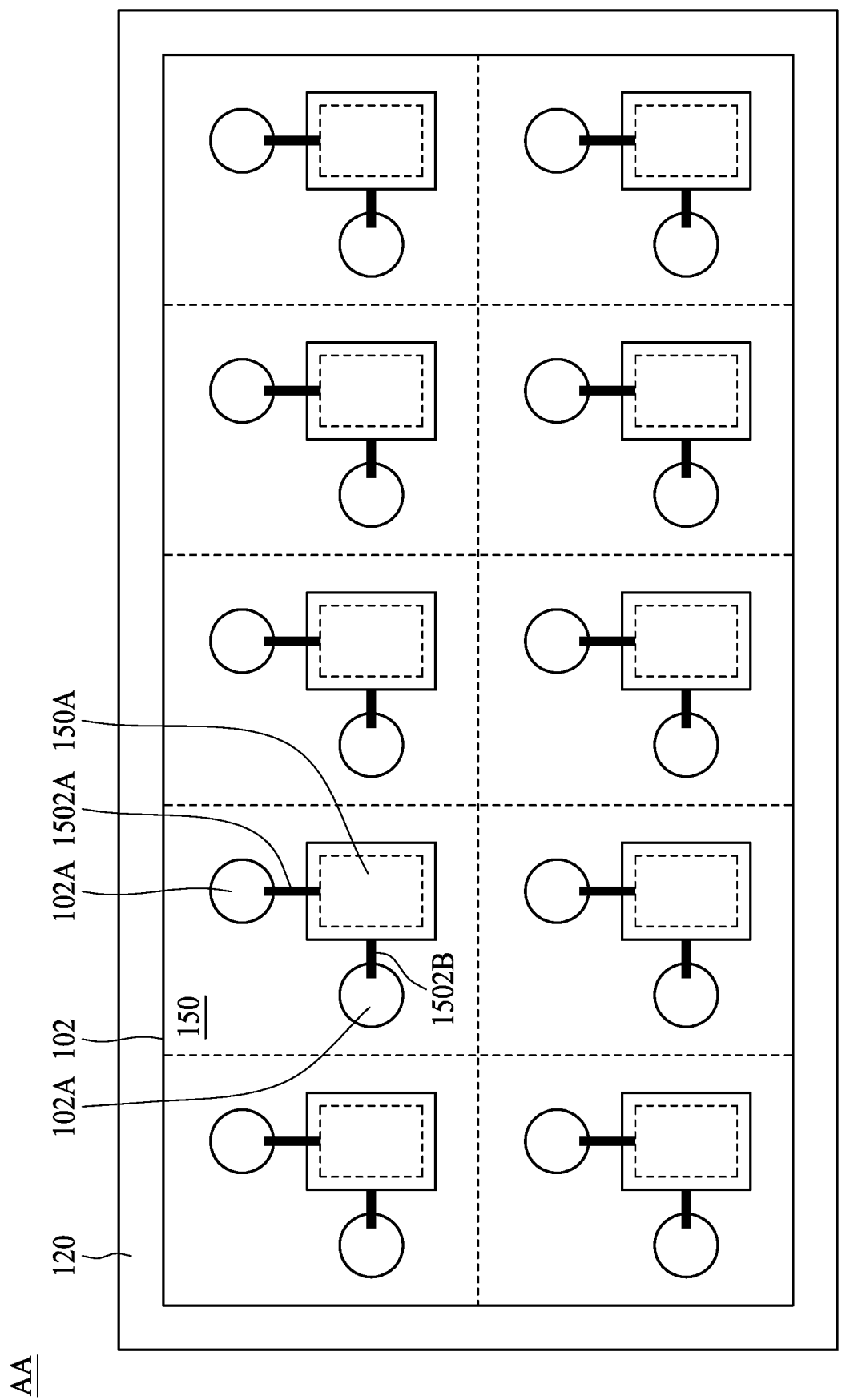
FIG. 1B illustrates a top view of a semiconductor package structure viewing from interface AA of FIG. 1 according to some embodiments of the present disclosure.

As shown in FIG. 1A, by way of example and not limitation, die 102 may include a five by two array of PMUT cell regions 150, and a sealing structure 120 is surrounding said five by two array of PMUT cell regions 150. In other words, the sealing structure encloses a plurality of PMUT cell regions 150 without separating adjacent PMUT cell regions 150. The circular PMUT shape seen in FIG. 1A is shown by way of example, while the present disclosure may be implemented in a range of geometries without departing from the disclosure. Referring to FIG. 1B, FIG. 1B illustrates a top view of a semiconductor package structure viewing from interface AA of FIG. 1 according to some embodiments of the present disclosure. FIG. 1B is similar to FIG. 1A except for that the membrane portion 150A may be in a tetragonal shape instead of a circular shape. By way of example and not limitation, the receiving portion 1502A/102A may be connected to a short side of the membrane portion 150A, and the transmission portion 1502B/102A may be connected to a long side of the membrane portion 150A.

Figure 2:
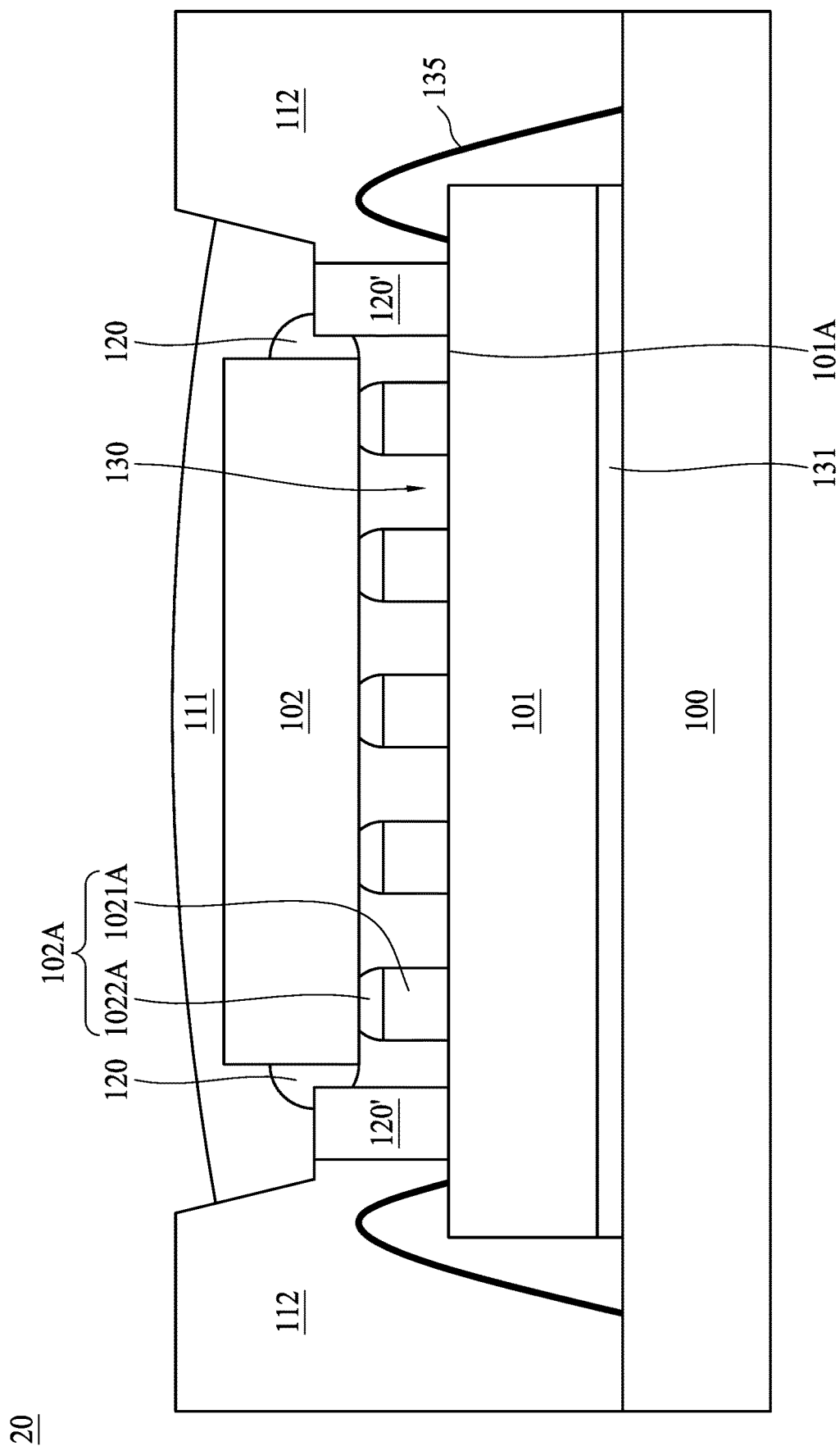
FIG. 2 illustrates a cross sectional view of a semiconductor package structure according to some embodiments of the present disclosure.

Referring to FIG. 2, FIG. 2 illustrates a cross sectional view of a semiconductor package structure 20 according to some embodiments of the present disclosure. Semiconductor package structure 20 is similar to semiconductor package structure 10 but with a different sealing structure 120/120' and different conductive terminals 102A. As shown in FIG. 2, in addition to solder joint 1022A, the conductive terminal 102A may further include a copper pillar 1021A extending from an active surface 101A of the die 101 toward the die 102. In some embodiments, one copper pillar 1021A is in connection with one solder joint 1022A, configured to electrically and mechanically connect die 102 and die 101. Sealing structure 120/120' of semiconductor package structure 20 include a dielectric wall 120' disposed on the active surface 101A of the die 101 and a dam structure 120 sealing between the dielectric wall 120' and a sidewall or an edge of the die 102. As shown in FIG. 2, an aspect ratio of the dielectric wall 120' is greater than an aspect ratio of the conductive terminals 102A so as to seal the space between die 102 and die 101 together with the dam structure 120. Under the condition of similar footprint, a height of the dielectric wall 120' is greater than a height of the conductive terminals 102A. The dam structure 120, the dielectric wall 120', the die 101, and the die 102 altogether define a cavity 130 accommodating the plurality of conductive terminals 102A. As previously described, the cavity 130 is air-filled, or an air cavity.

Figure 3:
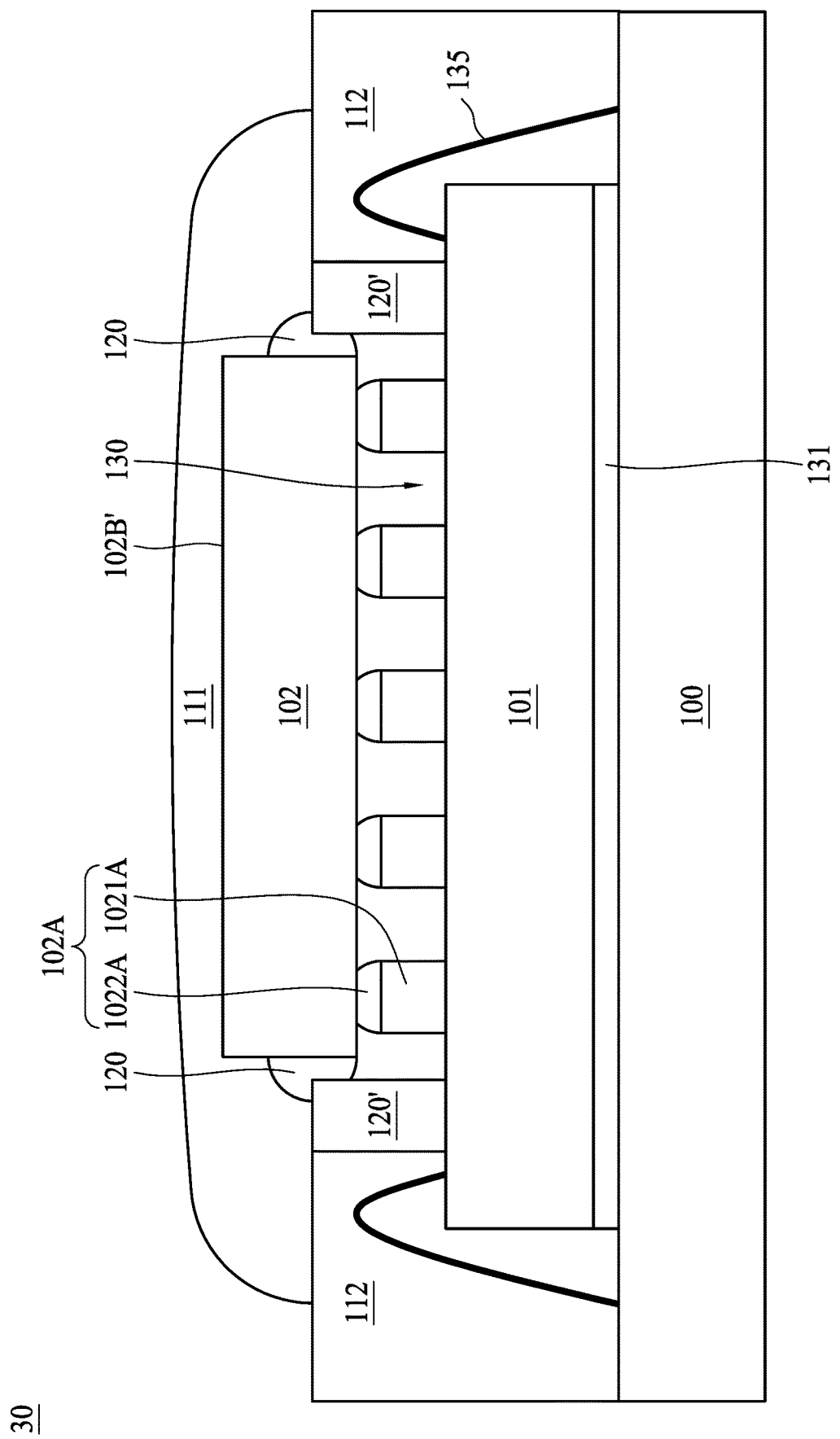
FIG. 3 illustrates a cross sectional view of a semiconductor package structure according to some embodiments of the present disclosure.

FIG. 3 illustrates a cross sectional view of a semiconductor package structure 30 according to some embodiments of the present disclosure. Semiconductor package structure 30 is similar to semiconductor package structure 20 but with a different arrangement of the encapsulant 112 and the sealing structure 120/120'. As shown in FIG. 3, a top surface of the encapsulant 112 is substantially coplanar with the dielectric wall 120' of the sealing structure 120/120'. Not being surrounded by the encapsulant 112, the encapsulant 111 of semiconductor package structure 30 is positioned on the substantially coplanar top surface of the encapsulant 112 and the dielectric wall 120' of the sealing structure 120/120'. Encapsulant 111 may also cover the back surface 102B' of the die 102, the sidewall of the die 102, and the dam structure 120 of the sealing structure 120/120'.

Figure 4:
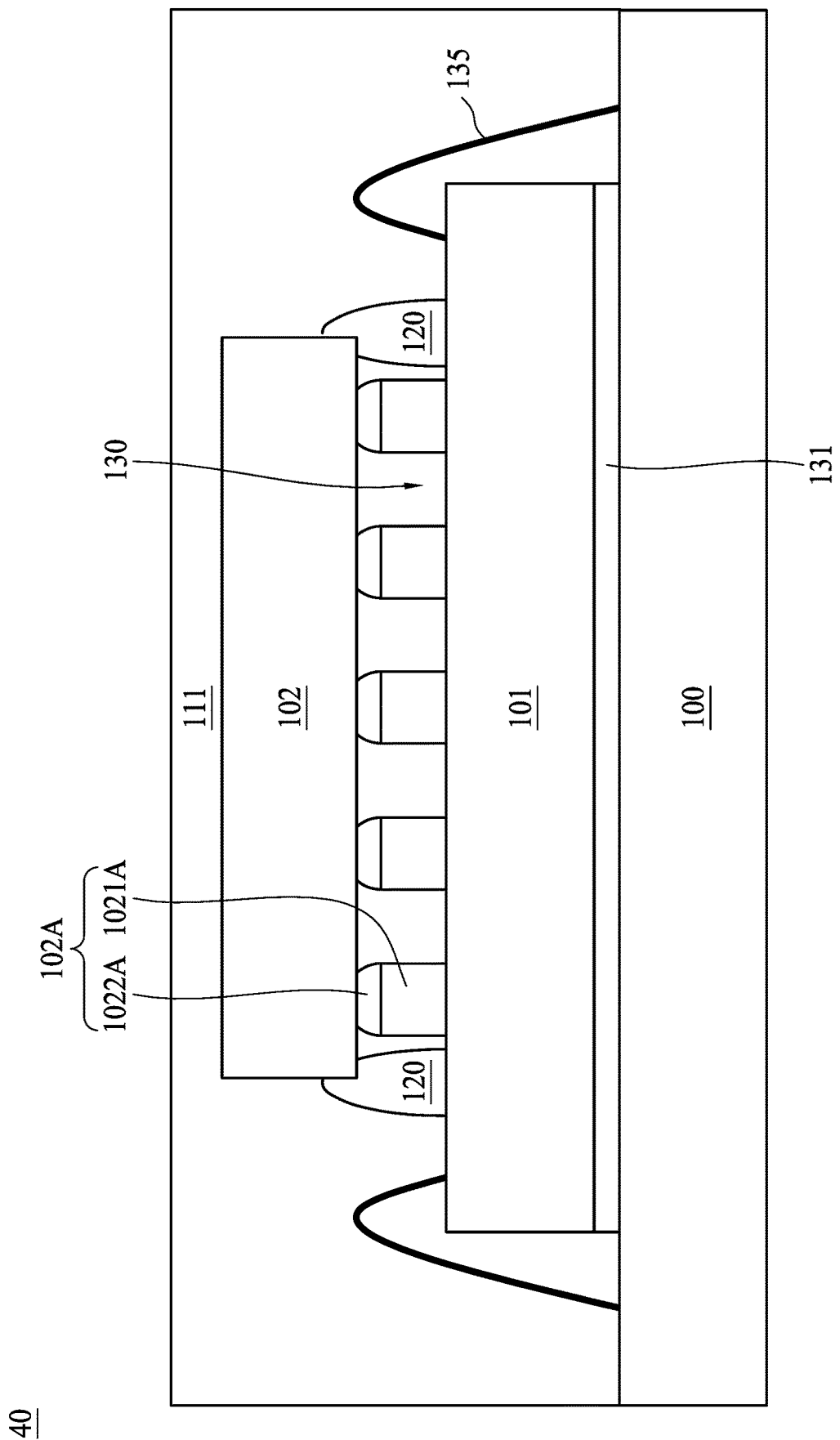
FIG. 4 illustrates a cross sectional view of a semiconductor package structure according to some embodiments of the present disclosure.

FIG. 4 illustrates a cross sectional view of a semiconductor package structure 40 according to some embodiments of the present disclosure. Semiconductor package structure 40 is similar to semiconductor package structure 30 but is free of the encapsulant 112. As shown in FIG. 4, encapsulant 111 covers the die 102 and also the die 101 underlying the die 102. Considering the mechanical property of the membrane portion of the die 102, molding compound operation, which may exert pressure on the object to be molded, is prevented from applying over the die 102. As a result, softer encapsulant 111 such as silicone is adopted for the general molding of the semiconductor package structure 40.

Figure 5A:
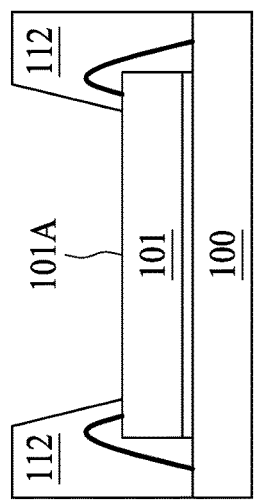
FIG. 5A, FIG. 5B, FIG. 5C, FIG. 5D, and FIG. 5E illustrate cross sectional views of the semiconductor package structure of FIG. 1 according to some embodiments of the present disclosure.
Figure 5B:
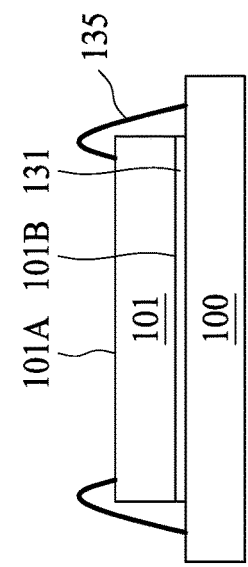

FIG. 5A, FIG. 5B, FIG. 5C, FIG. 5D, and FIG. 5E illustrate cross sectional views of the semiconductor package structure 10 of FIG. 1 according to some embodiments of the present disclosure. In FIG. 5A, a die 102, for example, a MEMS die, or a PMUT die, is provided and ball drop operation is conducted for PMUT die bumping. An array of conductive terminals 102A is arranged on a surface 102A' of the die 102 according to positions of the plurality of cell regions 150, as shown in FIG. 1A and FIG. 1B of the present disclosure. In FIG. 5B, another die 101 is bonded to a substrate 100 at its back surface 101B by, for example, a die attach layer (not shown in FIG. 5B). Under current operation, semiconductor substrate 100 may be in a form of a strip or panel. A plurality of the die 101 is pick-and-place over the substrate 100. Subsequently, conductive wire 135 is formed by wire bonding operation to electrically connect the active surface 101A of the die 101 and conductive pad or conductive traces (not shown) of the substrate 100. Optionally, an absorption layer 131 configured to absorb ultrasonic wave passing through the die 102 can be formed between the die 101 and the substrate 100.

Figure 5C:
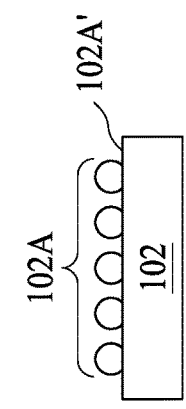
Figure 5D:
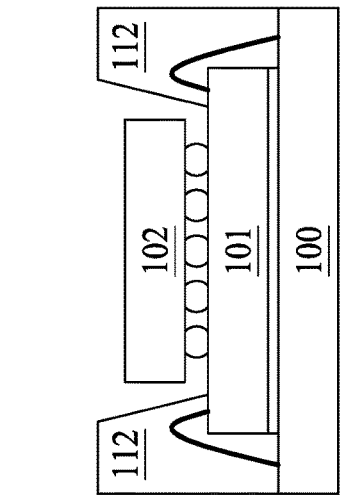

In FIG. 5C, an open cavity molding operation is applied to form encapsulant 112 on the substrate 100, surrounding the die 101 and encapsulating the bonding wires 135. An active surface 101A of the die 101 is free from coverage of the encapsulant 112 and is ready for connection with the die 102. As previously described, encapsulant 112 formed through open cavity mode can be resin, epoxy, or molding compound with various fillers. A thickness of the encapsulant 112 is designed to be greater than a sum of the thickness of the die 101 and the die 102. In FIG. 5D, the die 102 planted with conductive terminals 102A is bonded to the active surface 101A of the die 101 through a reflow operation. In some embodiments, the size of the die 102 is smaller than the size of the die 101, so that all the conductive terminals 102A on the die 102 can bonded to the corresponding conductive pads on the die 101 with a portion of the active surface 101A of the die 101 being occupied by the encapsulant 112. In present embodiment, a low-residue flux or fluxless reflow (e.g., formic acid reflow) may be adopted to reduce or minimize the volume of flux after reflow operation.

Figure 5E:
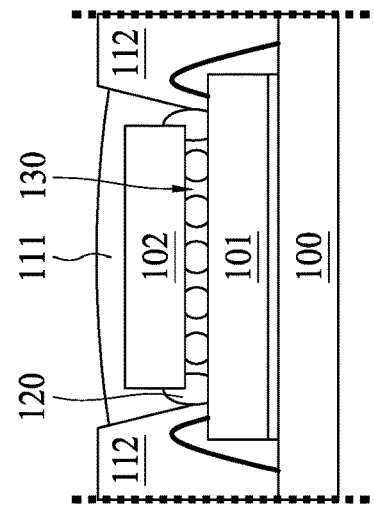

In FIG. 5E, a sealing structure 120 is formed on the active surface 101A of the die 101 and surrounding the conductive terminals 102A. The sealing structure can be dam structure composed of high viscosity dielectric materials which do not flow under the die 102 and contaminate active components, such as piezoelectric surface, membrane surface, or transducer surface, of the die 102. In some embodiments, forming the sealing structure 120 includes performing a dispensing operation. More fluidic encapsulant 111 is then applied to cover a back surface of the die 102 and being confined by the encapsulant 112. Because the sealing structure 120 is formed prior to the application of the encapsulant 111, such encapsulant 111 may not enter the space between die 102 and die 101, rendering a cavity 130 accommodating the plurality of the conductive terminals 102A. In some embodiments, the cavity 130 is an air cavity. Subsequently, the substrate 100 and the encapsulant 112 is separated through a package saw operation and the semiconductor package structure 10 of FIG. 1 is obtained.

Figure 6A:
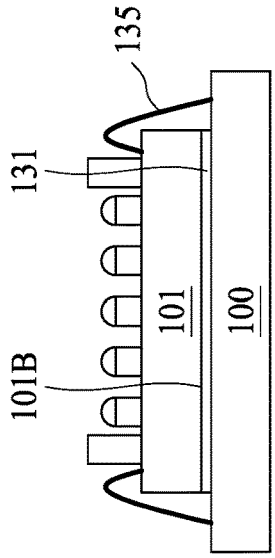
FIG. 6A, FIG. 6B, FIG. 6C, FIG. 6D, FIG. 6E and FIG. 6F illustrate cross sectional views of the semiconductor package structure of FIG. 2 according to some embodiments of the present disclosure.
Figure 6B:
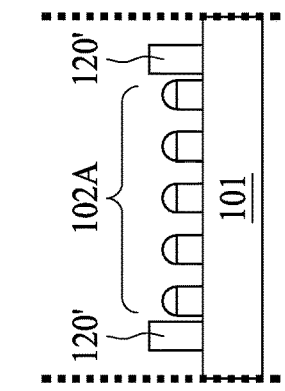

FIG. 6A, FIG. 6B, FIG. 6C, FIG. 6D, and FIG. 6E illustrate cross sectional views of the semiconductor package structure 20 of FIG. 2 according to some embodiments of the present disclosure. In FIG. 6A, a wafer, for example, a wafer including a plurality of die 101 regions, is provided and a copper pillar bumping operation is conducted at a wafer level to form a plurality of copper pillars 1021A and solder paste on each of the copper pillars 1021A in each of the die 101 regions. The solder paste is then reflowed to form solder bumps 1022A. The combination of the solder bumps 1022A and the copper pillars 1021A can be referred to the conductive terminals 102A of semiconductor package structure 20. In some embodiments, in order to prevent excessive solder from contaminating the active surface 101A of the die 101 and causing bridging between adjacent conductive terminals 102A, reduced volume of the solder paste may be used. In FIG. 6B, a patterned dielectric layer is formed on the wafer having a plurality of die 101 regions. From a cross sectional perspective, dielectric walls 120' are formed by a photoresist patterning operation to surround the conductive terminals 102A in each of the die 101 regions. Subsequently, the wafer is diced to form a plurality of separated dies 101.

Figure 6C:
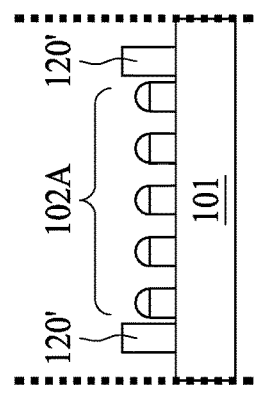
Figure 6D:
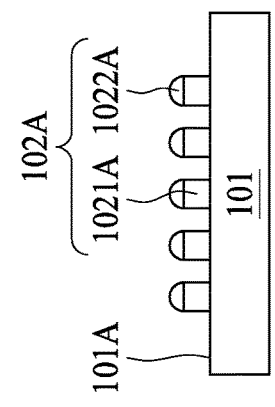

In FIG. 6C, the separated die 101 is bonded to a substrate 100 at its back surface 101B. Under current operation, semiconductor substrate 100 may be in a form of a strip or panel. A plurality of the die 101 is pick-and-place over the substrate 100. Subsequently, conductive wire 135 is formed by wire bonding operation to electrically connect the active surface 101A of the die 101 and conductive pad or conductive traces (not shown) of the substrate 100. Optionally, an absorption layer 131 configured to absorb ultrasonic wave passing through the die 102 (shown in FIG. 6E) can be formed between the die 101 and the substrate 100. In FIG. 6D, an open cavity molding operation is applied to form encapsulant 112 on the substrate 100, surrounding the die 101 and encapsulating the bonding wires 135. In some embodiments, a height of the dielectric wall 120' is greater than a height of the conductive terminal 102A, therefore, a protrusion of the molding case used in open cavity molding operation can be abutted with the top of the dielectric wall 120' without contacting the top of the conductive terminal 102A. An active surface 101A of the die 101 is free from coverage of the encapsulant 112 and is ready for connection with the die 102 (shown in FIG. 6E). As previously described, encapsulant 112 formed through open cavity mode can be resin, epoxy, or molding compound with various fillers. A thickness of the encapsulant 112 is designed to be greater than a sum of the thickness of the die 101 and the die 102.

Figure 6E:
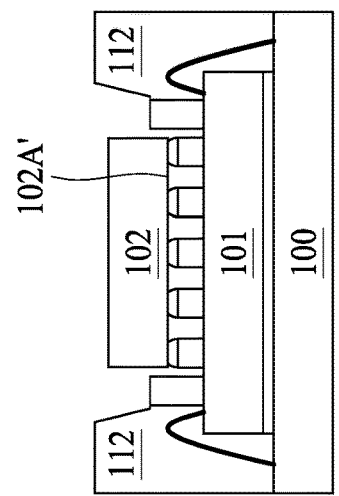
Figure 6F:
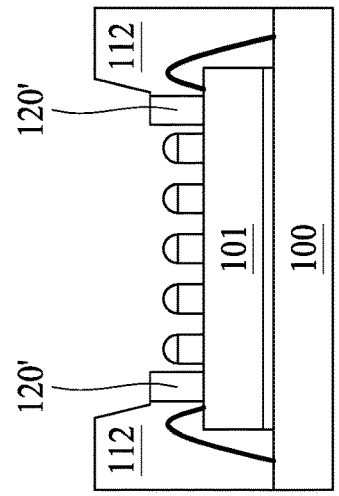

In FIG. 6E, another die 102, for example, a MEMS die, or a PMUT die, is bonded to the die 101 at its surface 102A' thorough a reflow operation. A plurality of die 102 is pick-and-place over the plurality of dies 101 on the substrate 100. In present embodiment, a low-residue flux or fluxless reflow (e.g., formic acid reflow) may be adopted to reduce or minimize the volume of flux after reflow operation. In FIG. 6F, a dam structure 120 is formed to gap the dielectric wall 120' and an edge or sidewall of the die 102. The sealing structure 120/120' surrounds the conductive terminals 102A. The dam structure 120 may be composed of high viscosity dielectric materials which do not flow under the die 102 and contaminate active components, such as piezoelectric surface, membrane surface, or transducer surface, of the die 102. In some embodiments, forming the dam structure 120 includes performing a dispensing operation. More fluidic encapsulant 111 is then applied to cover a back surface of the die 102 and being confined by the encapsulant 112. Because the sealing structure 120/120' is formed prior to the application of the encapsulant 111, such encapsulant 111 may not enter the space between die 102 and die 101, rendering a cavity 130 accommodating the plurality of the conductive terminals 102A. In some embodiments, the cavity 130 is an air cavity. Subsequently, the substrate 100 and the encapsulant 112 is separated through a package saw operation and the semiconductor package structure 20 of FIG. 2 is obtained.

Figure 7C:
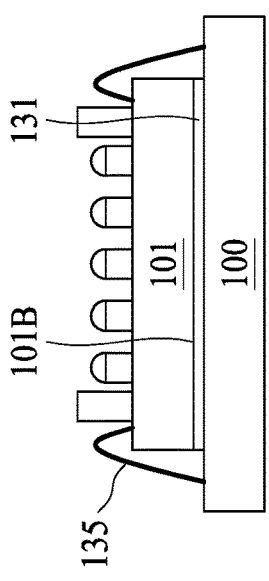
FIG. 7A, FIG. 7B, FIG. 7C, FIG. 7D, FIG. 7E, and FIG. 7F illustrate cross sectional views of the semiconductor package structure of FIG. 3 according to some embodiments of the present disclosure.
Figure 7F:
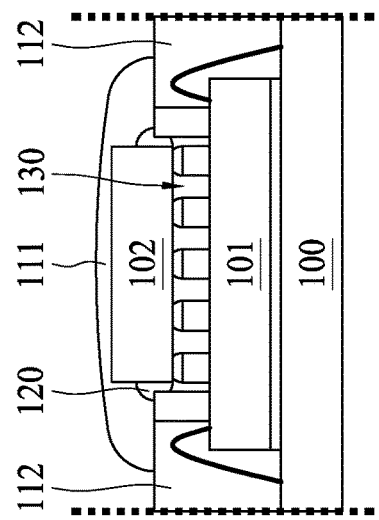
Figure 7B:
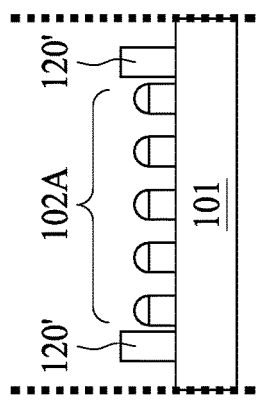
Figure 7E:
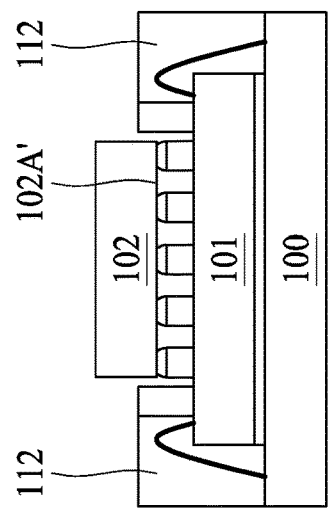
Figure 7A:
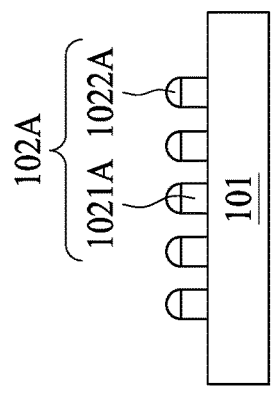

FIG. 7A, FIG. 7B, FIG. 7C, FIG. 7D, FIG. 7E, and FIG. 7F illustrate cross sectional views of the semiconductor package structure 30 of FIG. 3 according to some embodiments of the present disclosure. In FIG. 7A, a wafer, for example, a wafer including a plurality of die 101 regions, is provided and a copper pillar bumping operation is conducted at a wafer level to form a plurality of copper pillars 1021A and solder paste on each of the copper pillars 1021A in each of the die 101 regions. The solder paste is then reflowed to form solder bumps 1022A. The combination of the solder bumps 1022A and the copper pillars 1021A can be referred to the conductive terminals 102A of semiconductor package structure 30. In some embodiments, in order to prevent excessive solder from contaminating the active surface 101A of the die 101 and causing bridging between adjacent conductive terminals 102A, reduced volume of the solder paste may be used. In FIG. 7B, a patterned dielectric layer is formed on the wafer having a plurality of die 101 regions. From a cross sectional perspective, dielectric walls 120' are formed by a photoresist patterning operation to surround the conductive terminals 102A in each of the die 101 regions. Subsequently, the wafer is diced to form a plurality of separated dies 101.

Figure 7D:
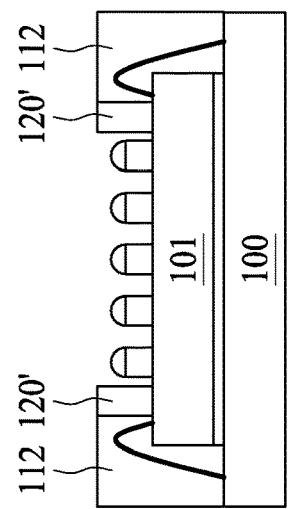

In FIG. 7C, the separated die 101 is bonded to a substrate 100 at its back surface 101B. Under current operation, semiconductor substrate 100 may be in a form of a strip or panel. A plurality of the die 101 is pick-and-place over the substrate 100. Subsequently, conductive wire 135 is formed by wire bonding operation to electrically connect the active surface 101A of the die 101 and conductive pad or conductive traces (not shown) of the substrate 100. Optionally, an absorption layer 131 configured to absorb ultrasonic wave passing through the die 102 (shown in FIG. 7E) can be formed between the die 101 and the substrate 100. In FIG. 7D, a flat mold molding operation is applied to form encapsulant 112 on the substrate 100, surrounding the die 101 and encapsulating the bonding wires 135. In some embodiments, a top surface of the encapsulant 112 is substantially coplanar with a top surface of the dielectric wall 120'. In some embodiments, a top surface of the encapsulant 112 may not be coplanar with a top surface of the dielectric wall 120', for example, by having a stair gap. An active surface 101A of the die 101 is free from coverage of the encapsulant 112 and is ready for connection with the die 102 (shown in FIG. 7E). As previously described, encapsulant 112 formed through open cavity mode can be resin, epoxy, or molding compound with various fillers. A thickness of the encapsulant 112 is designed to be greater than a sum of the thickness of the die 101 and conductive terminals 102A.

In FIG. 7E, another die 102, for example, a MEMS die, or a PMUT die, is bonded to the die 101 at its surface 102A' thorough a reflow operation. A plurality of die 102 is pick-and-place over the plurality of dies 101 on the substrate 100. In present embodiment, a low-residue flux or fluxless reflow (e.g., formic acid reflow) may be adopted to reduce or minimize the volume of flux after reflow operation. In FIG. 7F, a dam structure 120 is formed to gap the dielectric wall 120' and an edge or sidewall of the die 102. The sealing structure 120/120' surrounds the conductive terminals 102A. The dam structure 120 may be composed of high viscosity dielectric materials which do not flow under the die 102 and contaminate active components, such as piezoelectric surface, membrane surface, or transducer surface, of the die 102. More fluidic encapsulant 111 is then applied to cover a back surface of the die 102 and being confined by the encapsulant 112. Because the sealing structure 120/120' is formed prior to the application of the encapsulant 111, such encapsulant 111 may not enter the space between die 102 and die 101, rendering a cavity 130 accommodating the plurality of the conductive terminals 102A. In some embodiments, the cavity 130 is an air cavity. Subsequently, the substrate 100 and the encapsulant 112 is separated through a package saw operation and the semiconductor package structure 30 of FIG. 3 is obtained.

Figure 8A:
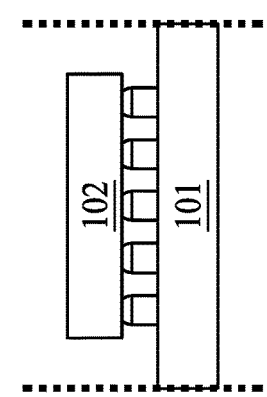
FIG. 8A, FIG. 8B, FIG. 8C, FIG. 8D, FIG. 8E, and FIG. 8F illustrate cross sectional views of the semiconductor package structure of FIG. 4 according to some embodiments of the present disclosure.
Figure 8B:
Figure 8C:

FIG. 8A, FIG. 8B, FIG. 8C, FIG. 8D, FIG. 8E, and FIG. 8F illustrate cross sectional views of the semiconductor package structure 40 of FIG. 4 according to some embodiments of the present disclosure. In FIG. 8A, a wafer, for example, a wafer including a plurality of die 101 regions, is provided and a copper pillar bumping operation is conducted at a wafer level to form a plurality of copper pillars 1021A and solder paste on each of the copper pillars 1021A in each of the die 101 regions. The solder paste is then reflowed to form solder bumps 1022A. The combination of the solder bumps 1022A and the copper pillars 1021A can be referred to the conductive terminals 102A of semiconductor package structure 40. In some embodiments, in order to prevent excessive solder from contaminating the active surface 101A of the die 101 and causing bridging between adjacent conductive terminals 102A, reduced volume of the solder paste may be used. In FIG. 8B, another die 102, for example, a MEMS die, or a PMUT die, is bonded to the wafer including a plurality of die 101 regions at its surface 102A' thorough a reflow operation. In some embodiments, the operation in FIG. 8B is performed under wafer-level. Compared to the operations in previous figures, no encapsulant has been formed after bonding the die 102 to the die 101 region on the wafer, a flux cleaning operation can be conducted in current embodiment to remove the flux residue near the solder joints, as shown in FIG. 8C. The wafer having a plurality of die 101 regions 101 is then separated to form a plurality dies 101, each of the dies 101 is bonded with at least a die 102.

Figure 8D:
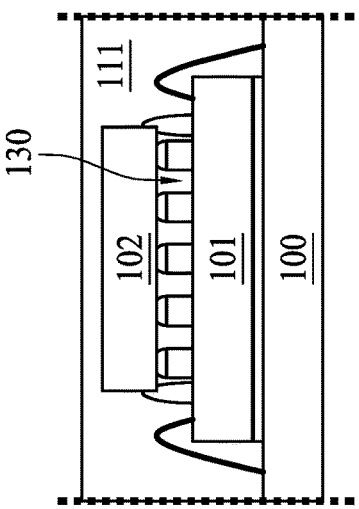
Figure 8E:
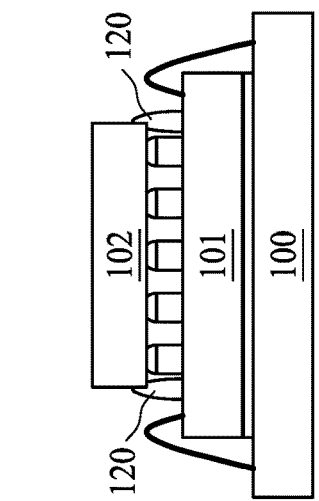
Figure 8F:
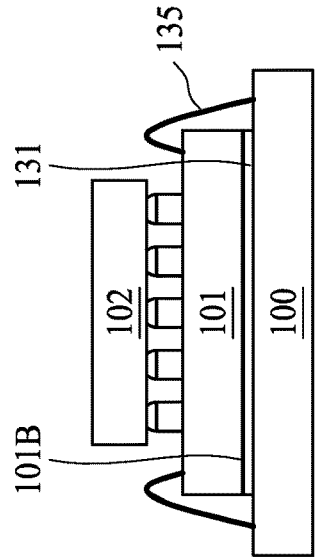

In FIG. 8D, the separated die 101 is bonded to a substrate 100 at its back surface 101B. Under current operation, semiconductor substrate 100 may be in a form of a strip or panel. A plurality of the die 101 is pick-and-place over the substrate 100. Subsequently, conductive wire 135 is formed by wire bonding operation to electrically connect the active surface 101A of the die 101 and conductive pad or conductive traces (not shown) of the substrate 100. Optionally, an absorption layer 131 configured to absorb ultrasonic wave passing through the die 102 can be formed between the die 101 and the substrate 100. In FIG. 8E, a sealing structure 120 is formed on the active surface 101A of the die 101 and surrounding the conductive terminals 102A. The sealing structure can be dam structure composed of high viscosity dielectric materials which do not flow under the die 102 and contaminate active components, such as piezoelectric surface, membrane surface, or transducer surface, of the die 102. In FIG. 8F, more fluidic encapsulant 111 is then applied over the substrate 100 to encapsulate the die 101 and the die 102. Because the sealing structure 120 is formed prior to the application of the encapsulant 111, such encapsulant 111 may not enter the space between die 102 and die 101, rendering a cavity 130 accommodating the plurality of the conductive terminals 102A. In some embodiments, the cavity 130 is an air cavity. Subsequently, the substrate 100 and the encapsulant 111 is separated through a package saw operation and the semiconductor package structure 40 of FIG. 4 is obtained.

Figure 9A:
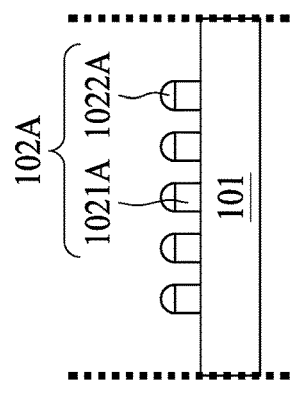
FIG. 9A, FIG. 9B, FIG. 9C, FIG. 9D, FIG. 9E, and FIG. 9F illustrate cross sectional views of the semiconductor package structure of FIG. 4 according to some embodiments of the present disclosure.
Figure 9B:
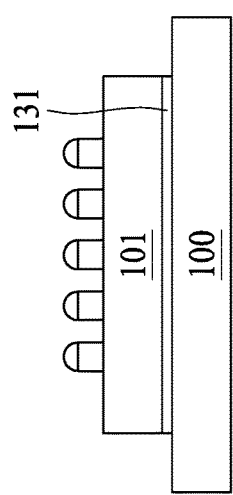

FIG. 9A, FIG. 9B, FIG. 9C, FIG. 9D, FIG. 9E, and FIG. 9F illustrate cross sectional views of the semiconductor package structure 40 of FIG. 4 according to some embodiments of the present disclosure. In FIG. 9A, a wafer, for example, a wafer including a plurality of die 101 regions, is provided and a copper pillar bumping operation is conducted at a wafer level to form a plurality of copper pillars 1021A and solder paste on each of the copper pillars 1021A in each of the die 101 regions. The solder paste is then reflowed to form solder bumps 1022A. The combination of the solder bumps 1022A and the copper pillars 1021A can be referred to the conductive terminals 102A of semiconductor package structure 40. In some embodiments, in order to prevent excessive solder from contaminating the active surface 101A of the die 101 and causing bridging between adjacent conductive terminals 102A, reduced volume of the solder paste may be used. Subsequently, the wafer having a plurality of die 101 regions is separated to form a plurality of separated dies 101. In FIG. 9B, the separated die 101 is bonded to a substrate 100 at its back surface 101B. Under current operation, semiconductor substrate 100 may be in a form of a strip or panel. A plurality of the separated die 101 is pick-and-place over the substrate 100. Optionally, an absorption layer 131 configured to absorb ultrasonic wave emitting from the die 102 (shown in FIG. 9C) can be formed between the die 101 and the substrate 100.

Figure 9C:
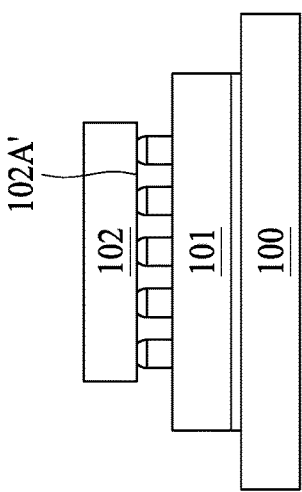
Figure 9D:
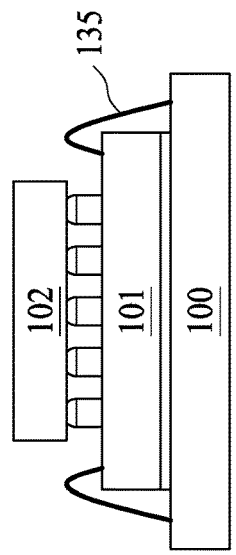

In FIG. 9C, another die 102, for example, a MEMS die, or a PMUT die, is bonded to each of the separated dies 101 at its surface 102A' thorough a reflow operation. Compared to the operations in previous figures, no encapsulant has been formed after bonding the die 102 to the die 101, a flux cleaning operation can be conducted in current embodiment to remove the flux residue near the solder joints, as shown in FIG. 9C. In FIG. 9D, conductive wire 135 is formed by wire bonding operation to electrically connect the active surface 101A of the die 101 and conductive pad or conductive traces (not shown) of the substrate 100.

Figure 9E:
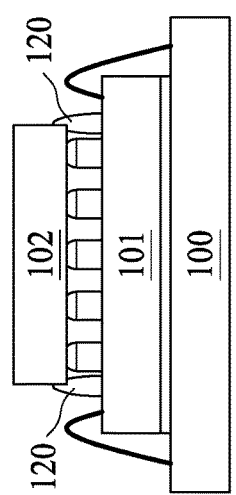
Figure 9F:
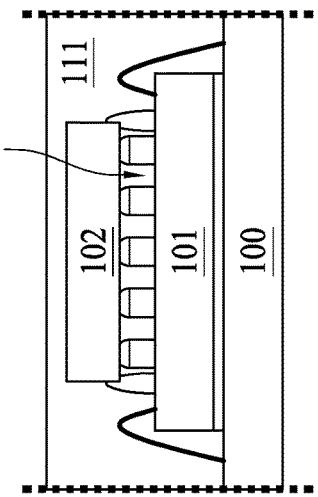

In FIG. 9E, a sealing structure 120 is formed on the active surface 101A of the die 101 and surrounding the conductive terminals 102A. The sealing structure can be dam structure composed of high viscosity dielectric material which do not flow under the die 102 and contaminate active components, such as piezoelectric surface, membrane surface, or transducer surface, of the die 102. In FIG. 9F, more fluidic encapsulant 111 is then applied over the substrate 100 to encapsulate the die 101 and the die 102. Because the sealing structure 120 is formed prior to the application of the encapsulant 111, such encapsulant 111 may not enter the space between die 102 and die 101, rendering a cavity 130 accommodating the plurality of the conductive terminals 102A. In some embodiments, the cavity 130 is an air cavity. Subsequently, the substrate 100 and the encapsulant 111 is separated through a package saw operation and the semiconductor package structure 40 of FIG. 4 is obtained.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor package structure, comprising:
   a substrate;
   a first die on the substrate;
   a second die on the first die, the second die comprising a plurality of cell regions, each of the cell regions comprising a membrane portion, a receiving portion connected to the membrane portion, and a transmission portion connected to the membrane portion; and
   a sealing structure surrounding the plurality of cell regions,
   wherein the transmission portion and the receiving portion each comprises a conductive terminal electrically connected to an active surface of the first die, and wherein the sealing structure, the first die, and the second die form an air cavity accommodating the conductive terminal.

2. The semiconductor package structure of claim 1, wherein the sealing structure surrounds and in contact with an edge of the second die.

3. The semiconductor package structure of claim 1, further comprising a first encapsulant at least encapsulating the second die.

4. The semiconductor package structure of claim 3, further comprising a second encapsulant at least surrounding the first die.

* * * * *